(12) United States Patent
Lu et al.

(10) Patent No.: US 9,391,519 B2
(45) Date of Patent: Jul. 12, 2016

(54) LOW QUIESCENT CURRENT PULL-DOWN CIRCUIT

(71) Applicant: Analog Devices Global, Hamilton (BM)

(72) Inventors: Danzhu Lu, Shanghai (CN); Xiaohan Gong, Shanghai (CN); Bin Shao, Shanghai (CN)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/311,907

(22) Filed: Jun. 23, 2014

(65) Prior Publication Data

US 2015/0349637 A1    Dec. 3, 2015

Related U.S. Application Data

(63) Continuation of application No. PCT/CN2014/078812, filed on May 29, 2014.

(51) Int. Cl.
*H03K 3/356* (2006.01)
*H02M 3/158* (2006.01)
*H03K 19/017* (2006.01)

(52) U.S. Cl.
CPC ............... *H02M 3/158* (2013.01); *H03K 3/356* (2013.01); *H03K 19/01721* (2013.01)

(58) Field of Classification Search
CPC ........... H03K 17/302; H03K 3/356165; G01R 19/16419; G11C 5/143
USPC ............. 327/94, 97, 112, 206, 427, 430, 437, 327/389, 538, 541; 307/50, 326; 365/189.07, 189.09, 226
See application file for complete search history.

(56) References Cited

U.S. PATENT DOCUMENTS

| | | | |
|---|---|---|---|
| 4,347,446 A | 8/1982 | Price | |
| 4,658,156 A * | 4/1987 | Hashimoto | G01R 19/16519 324/750.3 |
| 4,980,583 A | 12/1990 | Dietz | |
| 5,003,199 A | 3/1991 | Chuang et al. | |
| 5,712,575 A * | 1/1998 | Ma | G01R 31/31701 324/750.3 |
| 5,804,996 A * | 9/1998 | Verhaeghe | G01R 31/31721 324/750.3 |
| 5,838,177 A | 11/1998 | Keeth | |
| 6,031,403 A | 2/2000 | Gersbach | |
| 6,111,394 A * | 8/2000 | Casper | G05F 1/465 323/273 |
| 6,356,099 B1 * | 3/2002 | Lee et al. | H03K 3/3565 326/24 |
| 6,717,865 B2 * | 4/2004 | Laurent | G11C 5/143 327/205 |
| 6,781,443 B2 * | 8/2004 | Hamamoto | G05F 1/465 323/316 |
| 8,143,749 B2 * | 3/2012 | Gagne | H03K 19/0016 307/130 |
| 8,593,202 B2 * | 11/2013 | Mori | H04L 25/026 326/23 |

* cited by examiner

*Primary Examiner* — Rajnikant Patel
(74) *Attorney, Agent, or Firm* — Schwegman Lundberg & Woessner, P.A.

(57) ABSTRACT

A device to detect an electrical signal is provided. The device includes sensing, output, and pull-down nodes. The device includes a pull-down circuit having a native metal-oxide-semiconductor field-effect transistor (MOSFET) to pull down the output node to approximately a voltage of the pull-down node. The device includes a switch circuit having a junction field-effect transistor (JFET). The JFET turns on the pull-down circuit in response to a voltage of the sensing node being less than a first threshold. The JFET also turns off the pull-down circuit in response to the voltage of the sensing node being greater than the first threshold.

24 Claims, 9 Drawing Sheets

LOW QUIESCENT CURRENT PULL-DOWN CIRCUIT

CLAIM OF PRIORITY

This application is a continuation under 35 U.S.C. §111(a) and claims benefit of priority to International Patent Application Serial No. PCT/CN2014/078812, filed May 29, 2014, which is hereby incorporated by reference herein in its entirety.

TECHNICAL FIELD

This document pertains generally, but not by way of limitation, to voltage pull-down circuits.

BACKGROUND

Pull-down circuits are circuits used to pull-down nodes of a circuit to a predetermined low voltage level based on a condition, such as if the node is weakly driven. For example, the node may be weakly driven because the node is otherwise unconnected to a driver circuit. Alternatively, an external driver circuit could put the node in a high-impedance state. In these cases, without a pull-down circuit the voltage of the node may "float" and thereby provide false signals to circuitry receiving the voltage of the node as an input. Pull-down circuits may also be used in logic devices to generate outputs in accordance with logic levels. For example, an inverter circuitry may include a pull-down circuit to generate an output voltage at a low logic level based on the inverter's input. In some pull-down circuits, such as those using a pull-down resistor, a quiescent current can be generated when the pull-down circuit is not actively pulling down the node.

OVERVIEW

The systems, methods, and devices of the invention each have several aspects, no single one of which is solely responsible for its desirable attributes. Without limiting the scope of this invention as expressed by the claims which follow, some features will now be discussed briefly. After considering this discussion, and particularly after reading the section titled "Detailed Description," one will understand how the features of this invention provide advantages that include improving pull-down circuits, such as, but is not limited to, for low-power applications.

In one embodiment, an electrical signal detection circuit is disclosed. The circuit includes a sensing node, an output node, a pull-down node, a first pull-down circuit, and a switch circuit. The first pull-down circuit includes a native metal-oxide-semiconductor field-effect transistor (MOSFET) to pull down the output node to approximately a voltage of the pull-down node. The switch circuit includes a junction field-effect transistor (JFET) that turns on the first pull-down circuit in response to a voltage of the sensing node being less than a first threshold. The JFET also turns off the first pull-down circuit in response to the voltage of the sensing node being greater than the first threshold.

In another embodiment, an electrical signal detection circuit is disclosed. The circuit includes a first node, first and second power supply nodes, a pull-up circuit, and a pull-down circuit. The first node can provide an output voltage. The pull-up circuit can have a first end coupled to the second power supply node and a second end coupled to the first node. The first pull-down circuit includes a native re-channel metal-oxide-semiconductor field-effect transistor (MOSFET) and a p-channel junction field-effect transistor (JFET). The MOSFET has a drain, a source, and a gate. The drain of the MOSFET can be coupled to the second end of the pull-up circuit. The gate of the MOSFET can be coupled to the first power supply node. The JFET has a source coupled to the source of the MOSFET, a drain coupled to the first power supply node, and a gate coupled to the second power supply node.

In another embodiment, an electrical signal detection circuit is disclosed. The electrical signal detection circuit includes a first node to provide an output voltage. The electrical signal detection circuit further includes first and second power supply nodes. The electrical signal detection circuit further includes a pull-up circuit having a first end coupled to the second power supply node and a second end coupled to the first node. The electrical signal detection circuit further includes a pull-down circuit having a first end coupled to the first node and a second end coupled to the first power supply node. The pull-down circuit comprises a native re-channel metal-oxide-semiconductor field-effect transistor (MOSFET) having a drain, a source, and a gate. The drain of the MOSFET can be coupled to the second end of the current source. The gate of the MOSFET can be coupled to the first power supply node. The pull-down circuit can further include a p-channel junction field-effect transistor (JFET) having a source coupled to the source of the MOSFET, a drain coupled to the first power supply node, and a gate coupled to the first node.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
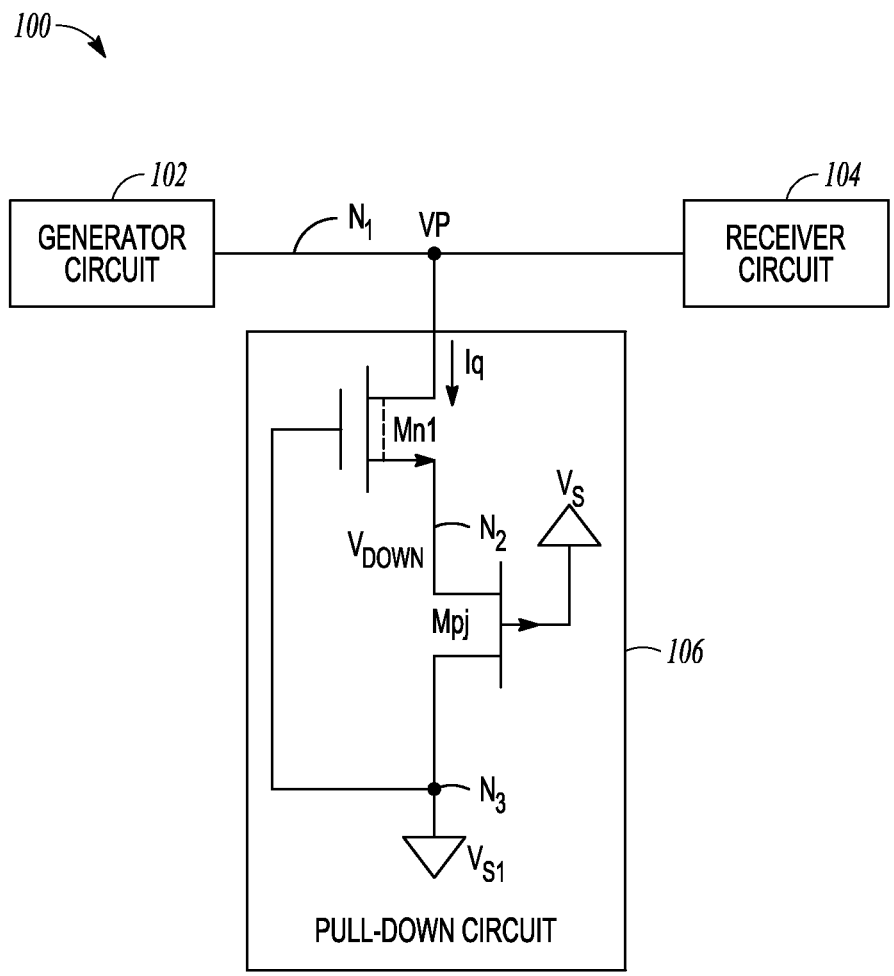
FIG. 1 is a schematic block diagram illustrating a system including a driver circuit interconnected with a receiver circuit and a pull-down circuit in accordance with various embodiments described herein.

The following detailed description of embodiments presents various descriptions of specific embodiments of the invention. However, the invention can be embodied in a multitude of different ways as defined and covered by the claims. In this description, reference is made to the drawings where like reference characters may indicate identical or functionally similar elements.

A pull-down circuit can be used to pull down a voltage Vp of a node selectively based on a sensed electrical characteristic, such as a voltage or a current. In one example aspect, the pull-down circuit can be used to generate the voltage Vp to indicate the occurrence of a condition or event. For example, the pull-down circuit can be used to pull down Vp if a sensed voltage or current of a power supply or bias circuit is below a threshold. In one embodiment, the voltage Vp may be used to shut off or reset external circuitry. In another example, a pull-down circuit can be used to pull down the voltage Vp of a node if the node enters a high-impedance state or becomes disconnected from a source/driver circuit. Accordingly, the pull-down circuit may be used to detect such a situation and to pull-down the voltage to a defined voltage level, such as ground or a negative rail of a power supply.

Some conventional pull-down circuits consume a substantial amount of current when the pull-down circuit is not activated (e.g., not pulling down the voltage Vp) or take up significant chip area. For example, a pull-down resistor Rd connected between a node N1 and ground may be used as a pull-down circuit for node N1. If the node N1 becomes disconnected from a driver or enters a high-impedance state, the resistor Rd may pull down the node N1 since there is no current flowing through the resistor Rd. On the other hand, if another circuit drives the voltage Vp high, a voltage potential is generated across the resistor Rd and ground, which generates a quiescent current Iq that flows through the resistor Rd to ground. Accordingly, such a pull-down resistor Rd may consume power even if the pull-down circuit is not active. In some applications, such as ultra-low power applications, the amount of current consumed by the pull-down circuit should be reduced. In an example embodiment, the current budget may be less than about 10 nanoamperes (nA). Accordingly, in order to attenuate the quiescent current Iq, a resistor Rd with a larger resistance may be used. However, producing a large resistance may result in using a large amount of chip area. Therefore, it may be a challenge to satisfy a power budget and a chip area budget. There is consequently a need for improved pull-down circuits.

Embodiments are described herein in the context of systems and methods for pull-down circuits applicable to, but is not limited to, electronics and circuits associated with low-power/ultra-low-power applications, including circuits related to power regulators, power harvesting, mobile devices, sensors, detectors, and transducers.

In one embodiment, the pull-down circuit forms a conduction path from a node N1 to a power supply node, such as ground. As will be described below in greater detail, the path may be selectively opened or closed based on a sensed electrical characteristic. Examples of the sensed electrical characteristic include a voltage and a current. A sensed electrical characteristic below the threshold will activate the pull-down circuit such that the pull-down circuit sets node N1 to approximately the voltage of the power supply. Alternatively, a sensed electrical characteristic above a threshold will deactivate the pull-down circuit such that pull-down circuit substantially electrically decouples the node N1 from the power supply. In this case, substantially no current flows through the pull-down circuit in a deactivated state.

The pull-down circuit may include an n-channel native metal-oxide-semiconductor field-effect transistor (MOSFET) and a p-channel junction field-effect transistor (JFET) interconnected to form the conduction path. The JFET may serve as a switch that turns on and off based on the sensed electrical characteristic. The native MOSFET serves to trim the level at which the electrical characteristic will turn off the JFET. Various embodiments are described in greater detail below.

Example Embodiments of Pull-Down Circuits

To further illustrate, FIG. 1 is a schematic block diagram illustrating a system 100 including a generator circuit 102 interconnected with a receiver circuit 104 and a pull-down circuit 106 in accordance with various embodiments described herein. The pull-down circuit 106 includes transistors Mn1 and Mpj. It will be understood by a person of ordinary skill that other embodiments of the system 100 may include more or less elements that are shown in FIG. 1.

The generator circuit 102 and the receiver circuit 104 may be interconnected via node N1. The generator circuit 102 may correspond to any suitable circuit configured to provide a signal, and the receiver circuit 104 may correspond to any suitable circuit configured to receive the signal. For example, the generator circuit 102 may be configured to generate a voltage Vp at node N1 as an output. Furthermore, the receiver circuit 104 may be configured to receive the voltage Vp of node N1 as an input. In one embodiment, the generator circuit 102 and the receiver circuit 104 may be circuitry suitable for performing one or more various functions related to power supplies and power regulators. However, one skilled in the art will appreciate that in alternative embodiments the generator circuit 102 and the receiver circuit 104 may correspond to any suitable circuitry forming an input-output interface.

In an example embodiment, in operation, the generator circuit 102 may enter a state in which the output Vp is weakly driven by the generator circuit 102. For example, the generator circuit 102 may become disconnected from N1 or may enter a high-impedance state. Accordingly, the voltage Vp may "float" if the voltage is not pulled down by the pull-down circuit 106, as described below.

The pull-down circuit 106 of FIG. 1 may correspond to a circuit configured to sense an electrical characteristic VS and pull down the voltage Vp at the node N1 based on the sensed electrical characteristic VS. For example, the pull-down circuit 106 has a first end operatively coupled to the node N1 ("an output node"), a second end operatively coupled to a power supply VS1 (e.g., a ground terminal or a "pull-down node"), and a third end configured to receive a sensed electrical characteristic VS at a "sensing node". In particular, in the illustrated embodiment, the transistor Mn1 of the pull-down circuit 106 has a drain operatively coupled to the node N1, a gate operatively to the power supply VS1, and a source operatively coupled to the node N2. Additionally, the transistor Mpj has a source operatively coupled to the node N2, a drain operatively coupled to a node N3, and a gate configured to receive the sensed voltage VS.

Accordingly, the transistors Mn1 and Mpj may form a conduction path between node N1 and the power supply VS1 that opens and closes in response to the sensed electrical characteristic VS. For example, the transistor Mn1 may serve as a pull-down transistor of the pull-down circuit 106 and the transistor Mpj may serve as a switch that turns the pull-down circuit 106 on or off based on VS. That is, the transistor Mpj turns on the pull-down circuit 106 by activating and thus allowing current to flow through the conduction path. And the transistor Mpj turns off the pull-down circuit by deactivating (e.g., entering pinch off) and thus substantially inhibiting current from flowing through the conduction path. The pull-down circuit 106 will be described in greater detail below.

The illustrated transistor Mpj may correspond to a JFET device. As such, the gate junction of the transistor Mpj may correspond to a reverse biased p-n junction that separates the gate from the body. With such a gate junction, positive gate-source voltage VGS causes a depletion layer to form in the p-channel that restricts current (e.g., Iq) from flowing from the source to the drain. At a particular gate-source voltage VGS called the pinch-off voltage Vthj, the depletion layer covers the width of the conduction channel and substantially inhibits channel current from flowing between the source and draing—e.g., there is substantially no drain current conducted by the transistor Mpj. Thus, the amount of drain current that may flow through the transistor Mpj may have a peak at about zero VGS and decreases for increasing VGS until conduction is substantially inhibited at the pinch-off voltage Vthj. In an example embodiment, the transistor Mpj has a channel width selected to be about 2 micrometers (μm) and a channel length selected to be about 6 μm. As a result, the pinch-off voltage may be in the range of about 1.2 V to about 1.6 V. However, in alternative embodiments, any applicable transistor sizes may be selected and other pinch-off voltages may result.

Accordingly, in operation, the transistor Mpj of the pull-down circuit 106 may serve as a switch for the conduction path formed by Mn1 and Mpj that opens or closes the conduction path in response to the sensed electrical characteristic VS. As will be described later, in some embodiments, the gate of Mpj may be connected to node N1 to sense VP or connected to another node to sense a second power supply VS2 ("pull-up node;" not shown). When the sensed voltage VS is nearly zero, the transistor VS is activated and may conduct a current Iq. As VS increases, the gate-source voltage VGS eventually reaches pinch off and the transistor Mpj deactivates and substantially inhibits Iq.

The illustrated transistor Mn1 of the pull-down circuit 106 may correspond to a MOSFET, such as an n-channel native MOSFET. Accordingly, the gate junction of the transistor Mn1 may include an insulator (e.g., $SiO_2$) between the gate and the body. Examples of a native MOSFET device may include transistors formed in a doped semiconductor region. The channel of a native transistor may not have undergone substantial surface depletion or surface enhancement. That is, the channel may be formed on the surface of the doped region without applying ion implantation or diffusion after the formation of the well. In an example embodiment, a semiconductor process forms the native n-channel MOSFET directly put on the substrate without a p-well so that the doping concentration of channel is approximately that of the substrate. However, in an alternative embodiment, an re-channel MOSFET may be formed in a p-well.

As a result, a native MOSFET device may have a threshold voltage Vthn of about zero voltage. The threshold voltage Vthn of a MOSFET is the gate-source VGS at which the MOSFET turns ON (e.g., operate in the saturation, triode, or near the sub-threshold-triode regime). Accordingly, the transistor Mn1 may turn ON near-zero gate-source voltages VGS or even at negative gate-source voltages VGS. As will be described, a near-zero threshold voltage Vthn can aid the pull-down circuit in activating (and, e.g., pulling down Vp) at low voltages. In one embodiment, the threshold voltage Vthn of the transistor Mn1 can be selected in the range of about −0.3 V to about −0.1 V. In yet another embodiment, the threshold voltage Vthn of the transistor Mn1 may be selected to be less than the threshold voltage of an enhancement-mode MOSFET. For example, the threshold voltage Vthn of the transistor Mn1 may be selected to be less about 50 millivolts. In an example embodiment, the transistor Mn1 has a channel width selected to be about 2 μm and a channel length selected to be about 10 μm. However, in alternative embodiments, any applicable transistor sizes may be selected.

As stated, the transistor Mn1 forms part of the conduction path of the pull-down circuit. In particular, the transistor Mn1 has a drain coupled to the node N1 and a source coupled to the source of the transistor Mpj. In operation, a gate-source voltage VGS of Mn1 is generated in response to the current Iq flowing across the drain and source terminals of the transistor Mn1. Since the gate of Mn1 is connected to the power supply VS1 and is relatively fixed at that voltage, changes of the gate-source voltage VGS of Mn1 manifest as changes in the voltage of the source of Mn1 (e.g., the voltage VDOWN at N2). As a result, the transistor Mn1 may be used to adjust the gate-source voltage VGS of Mpj and trim the voltage (turn over voltage) of VS that results in Mpj pinching off.

Moreover, because the threshold voltage Vthn of transistor Mn1 is nearly zero, the transistor Mn1 may operate in the ON state and conduct current for substantially low voltages, such Vp. To illustrate this, consider, for example, that Vp is a low voltage. This will result in a low voltage VDOWN at N2 (e.g., the source of Mn1). In turn, the gate-source voltage VGS of Mn1 will be approximately zero. Since the threshold voltage Vthn is nearly zero, the transistor Mn1 may operate in the ON state. In contrast, if the threshold voltage Vthn is larger, then the transistor Mn1 may stay in the OFF state and the voltage VP may be allowed to float.

In operation, as stated, the pull-down circuit 106 may pull the voltage Vp down to the voltage of the power supply VS1 if the generator circuit 102 does not override the action of the pull-down circuit 106. If the driver circuit 102 overcomes the pull-down circuit 106, the pull-down circuit 106 may deactivate and may not substantially alter the voltage Vp of the node N1 as provided by the generator circuit 102. Additionally, the pull-down circuit 106, if deactivated, may attenuate the quiescent current Iq flowing through the pull-down circuit 106. By setting the voltage Vp in this way, the pull-down voltage may serve to hold Vp at a low logic level if, for instance, the generator circuit 102 enters a high-impedance state or becomes disconnected.

For example, if the voltage drop VS-VS1 (e.g., the gate-source voltage of the transistor Mpj) is less than the pinch-off voltage of the transistor Mpj, the transistor Mpj may operate in the ON state. As a result, the node N2 is pulled to about the voltage of the power supply VS1. In turn, since the source of the transistor Mn1 is operatively coupled to the node N2, the source of Mn1 is pulled to approximately the voltage supply VS1, and the transistor Mn1 may enter the ON state. Consequently, the voltage Vp of the node N1 is also pulled down to about VS2. As VS increases, the gate-source voltage VS-VS1 of the transistor Mpj approaches the pinch-off voltage and the quiescent current Iq decreases. When the gate-source voltage VS-VS1 of the transistor Mpj becomes greater than the pinch-off, conduction through Mpj substantially stops. As a result, the current flowing through the transistor Mn1 is blocked by the transistor Mpj such that the voltage of node N2 increases. When the voltage of node N2 becomes greater than about −Vthn, Mn1 substantially deactivates. Accordingly, the pull-down circuit does not substantially affect the voltage Vp and the current Iq is substantially zero.

In one embodiment, the electrical characteristic VS sensed by the gate of the transistor Mpj may correspond to the second power supply VS2 (e.g., $V_{dd}$). In this case, the pull-down circuit 106 may serve to sense or detect the power supply VS2 and pull-down the voltage Vp at the node N1 if the voltage Vp is less than a predetermined threshold, as will be described in greater detail in connection with FIG. 2A. Accordingly, the pull-down circuit 106 may serve as part of a detection circuit for monitoring a voltage signal or supply. Embodiments of such circuits will be described, by way of non-limiting examples, in connection with FIGS. 2A, 2B, and 4-7B.

In another embodiment, the electrical characteristic VS sensed by the transistor Mpj may correspond to the voltage Vp of the node N1. In this case, the pull-down circuit 106 may serve to sense or detect the current provided to node N1, and pull-down the voltage Vp at the node N1 if the current is less than a predetermined threshold, as will be described in greater detail in connection with FIG. 3A. Accordingly, the pull-down circuit 106 may serve as part of a detection circuit for monitoring a current signal or supply. Embodiments of such circuits will be described, by way of non-limiting examples, in connection with FIGS. 3A, 3B, 8 and 9.

Figure 2A:
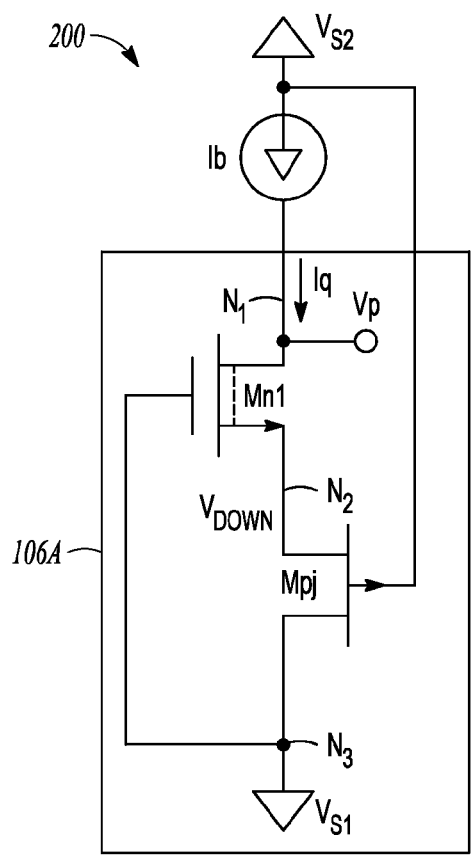
FIG. 2A is a schematic circuit diagram illustrating an example embodiment of a logic circuit including a pull-up circuit and a pull-down circuit.

FIG. 2A is a schematic circuit diagram illustrating an example embodiment of a logic circuit 200 including a pull-up circuit, such as a bias current source Ib, and a pull-down circuit 106A. The pull-down circuit 106A includes a transistor Mn1 and a transistor Mpj. The logic circuit may be coupled to a first and second power supplies VS1, VS2. Elements common to the schematics of FIGS. 1 and 2A share common reference indicia, and only differences between the schematics are described herein for the sake of brevity.

The bias current source Ib may correspond to circuitry which may be configured to produce a current Iq for biasing the pull-down circuit 106A and configured to selectively pull up the voltage Vp of the node N1. For example, in the illustrated embodiment, the bias current source Ib has a first end operatively coupled to the second power supply VS2 and a second end operatively coupled to a first end of the pull-down circuit 106A. In operation, if the power supply VS2 is sufficient for activating the bias current source Ib, then the bias current source Ib may activate and provide a current to the pull-down circuit. Serving as a current source, the bias current source Ib may operate for a range of voltages VS2-Vp, allowing the pull down circuit 106A to set the voltage Vp.

The pull-down circuit 106A may include circuitry configured to selectively pull down the voltage Vp at the node N1. For example, the pull-down circuit may be configured to sense the voltage of the second power supply VS2. If the power supply VS2 is below a threshold voltage ("turn-over voltage") Vth_sys, then the pull-down circuit 106A may be configured to set the voltage Vp of the node N1 to approximately VS1. If the power supply VS2 is above the turn-over voltage Vth_sys, the pull-down circuit 106A may be configured to deactivate. In this case, the bias current source Ib may serve to pull up the voltage Vp to the second voltage supply VS2.

In particular, in the illustrated embodiment, the transistor Mn1 of the pull-down circuit 106A has a drain operatively coupled to the node N1, a gate operatively to the power supply VS1, and a source operatively coupled to the node N2. Additionally, the transistor Mpj of the pull-down circuit 106A has a source operatively coupled to the node N2, a drain operatively coupled to a node N3, and a gate operatively coupled to the second power supply VS2.

In one aspect, the transistor Mn1 may receive the bias current Iq and may bias the nodes N1 based on the bias current Iq. For example, the transistor Mn1 may generate a drain voltage (e.g., Vp at the node N1) relative to the source voltage (e.g., VDOWN at the node N2) in accordance with the transistor Mn1 conducting the bias current Iq. As stated, the voltage VDOWN is set by the transistor Mpj based on the transistor Mpj conducting the bias current Iq (e.g., the current Iq sets the gate-source voltage Vgs of the transistor Mpj and the gate of Mpj is fixed at VS2). The transistor Mn1 may be sized, in part, to effectuate a particular turn-over voltage Vth_sys. The turnover voltage will be described in greater detail in connection with FIG. 4 regarding an example embodiment that is robust to temperature variations.

The current source Ib can be selected to affect the turnover voltage Vth_sys. For example, increasing the generated bias current Iq in FIG. 2A may decrease the gate-source voltage Vgs of the transistor Mpj and thus increase the voltage VDOWN at the node N2 (as stated, the gate of Mpj is fixed at VS2). The increased bias current Iq and the increased voltage VDOWN may decrease the voltage of VS2 that results in the voltage Vp of the node N1 being pulled high by the (non-ideal) current source Ib and thus results in a decreased turn-over voltage Vth_sys. As, stated the turnover voltage will be described in greater detail in connection with FIG. 4 regarding an example embodiment that is robust to temperature variations.

Figure 2B:
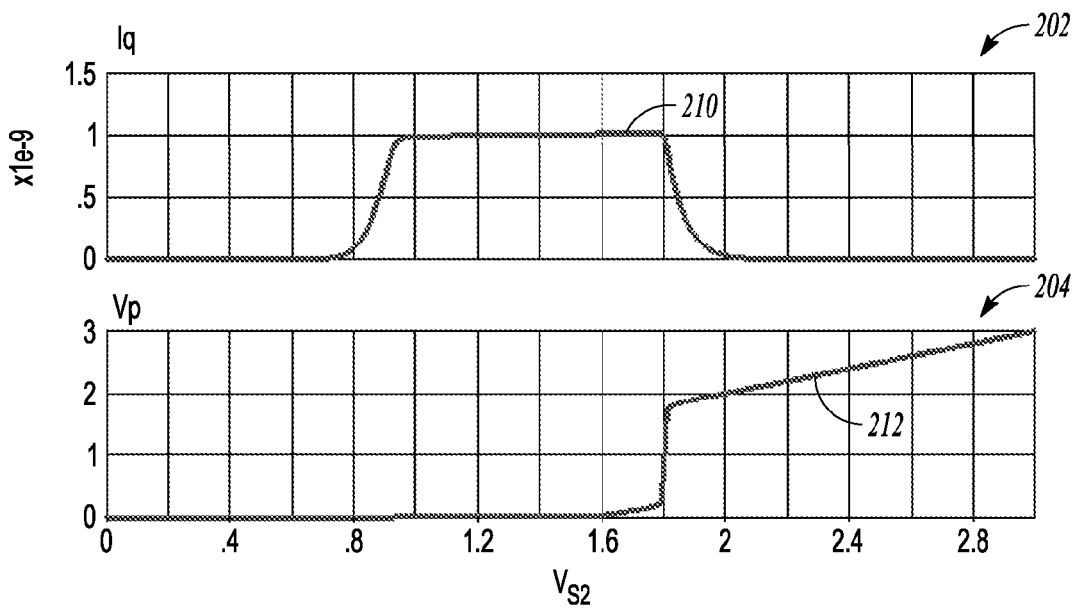
FIG. 2B are plots of example electrical characteristics of the embodiment of the logic circuit of FIG. 2A.

FIG. 2B are plots of example electrical characteristics of the embodiment of the pull-down circuit 106A of FIG. 2A. FIG. 2B may serve to illustrate the operation of the logic circuit 200 of FIG. 2A and thus FIG. 2B will be described with further reference to FIG. 2A. The plot 202 illustrates the quiescent current Iq (e.g., the current provided by the bias current source Ib of FIG. 2A) of the pull-down circuit 106A, and the plot 204 represents the output voltage Vp of the logic circuit 200. The quiescent current Iq is represented by the vertical axis of plot 202. The output voltage Vp is represented by the vertical axis of plot 204. The second power supply VS2 is represented by the horizontal axis of the plots 202, 204. Line 210 of the plot 202 represents the quiescent current Iq as a graph with respect to the second power supply VS2. Line 212 of the plot 204 represents the output voltage Vp as a graph with respect to the second power supply VS2.

In operation, as stated, the gate of the transistor Mpj may sense the voltage of the second power supply VS2. As shown in the plots 202, 204 for the second power supply VS2 in the range of about 0 V to about 0.8 V, the pull-down circuit 106A may pull the voltage Vp of node N1 to approximately the voltage of the first power supply VS1. For example, if the second power supply VS2 is less than about 0.8 V, the gate-source voltage of the transistor Mpj is less than about the pinch-off voltage Vthj. Thus, the transistor Mpj is in the ON state and sets the voltage VDOWN of the node N2 to a voltage corresponding to approximately the first power supply VS1. In turn, the source of the transistor Mn1 (e.g., VDOWN of node N2) is pulled down to approximately the first power supply VS1 and thus the gate-source voltage of the transistor Mn1 is approximately zero. Because the threshold voltage of the transistor Mn1, being a native transistor, is approximately zero, the transistor Mn1 operates in the ON state and pulls down the voltage Vp of node N1 to approximately the voltage of the first power supply VS1. In other words, the transistors Mn1, Mpj work together in that the transistor Mpj pulls down N2, which causes the transistor Mn1 to pull down N1.

As shown in the plots 202, 204, as the second power supply VS2 increases to a value in the range of about 0.8 V to about 1.8 V, the bias current source Ib may become activated and may produce a bias current Iq (e.g., the quiescent current Iq of plot 202) that flows through the pull-down circuit 106A. If the gate-source voltage of the transistor Mpj is less than its pinch-off voltage Vthj, the transistors Mn1 and Mpj remain in the ON state, and thus the voltage Vp of the node N1 remains set to approximately to the first power supply VS1, as shown in the plots 202, 204 for VS2 in the range of about 0.8 V to about 1.8 V.

In another aspect of operation, as the second power supply VS2 increases, the source-gate voltage of the transistor Mpj may become greater than the pinch-off voltage Vthj of the transistor Mpj, as shown in plots 202, 204 for VS2 greater than about 1.8 V. Consequently, the transistor Mpj may turn OFF (e.g., at pinch off) and may substantially inhibit the bias current Iq from flowing through the pull-down circuit 106A. Since the bias current Iq is forced to approximately zero by the pull-down circuit 106A, the bias current source Ib pulls the voltage Vp of the node N1 to approximately the second power supply VS2. Thus, in one aspect, the pull-down circuit 106A operates with substantially no quiescent current Iq when the pull-down circuit 106A is deactivated (e.g., not pulling down the voltage Vp of the node N1).

Figure 3A:
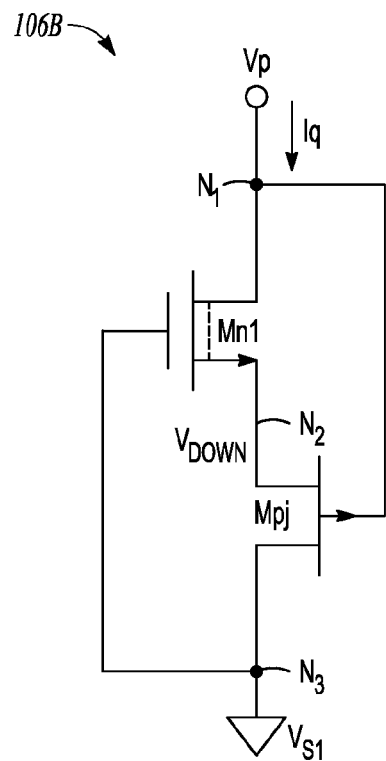
FIG. 3A is a schematic circuit diagram illustrating another example embodiment of a pull-down circuit of FIG. 1.

FIG. 3A is a schematic circuit diagram illustrating another example embodiment of a pull-down circuit 106B of FIG. 1. The pull-down circuit 106B includes a transistor Mn1 and a transistor Mpj. The pull-down circuit 106B may be coupled to a first power supply VS1. The pull-down circuit may be configured to provide the voltage Vp at the node N1 as an output. Elements common to the schematics of FIGS. 1 and 2A share common reference indicia, and only differences between the schematics are described herein for the sake of brevity.

In the illustrated embodiment, the electrical characteristic sensed by the gate of the second transistor corresponds to the voltage Vp of the node N1. For example, the gate of the transistor Mpj may be operatively coupled to the node N1. As such, the pull-down circuit 106B may serve to sense or detect the current Iq provided to the node N1, as will be described in greater detail below in connection with FIG. 3B. It will be appreciated by one skilled in the art that the current Iq may be provided by any circuit suitable for sourcing and/or sinking current.

Figure 3B:
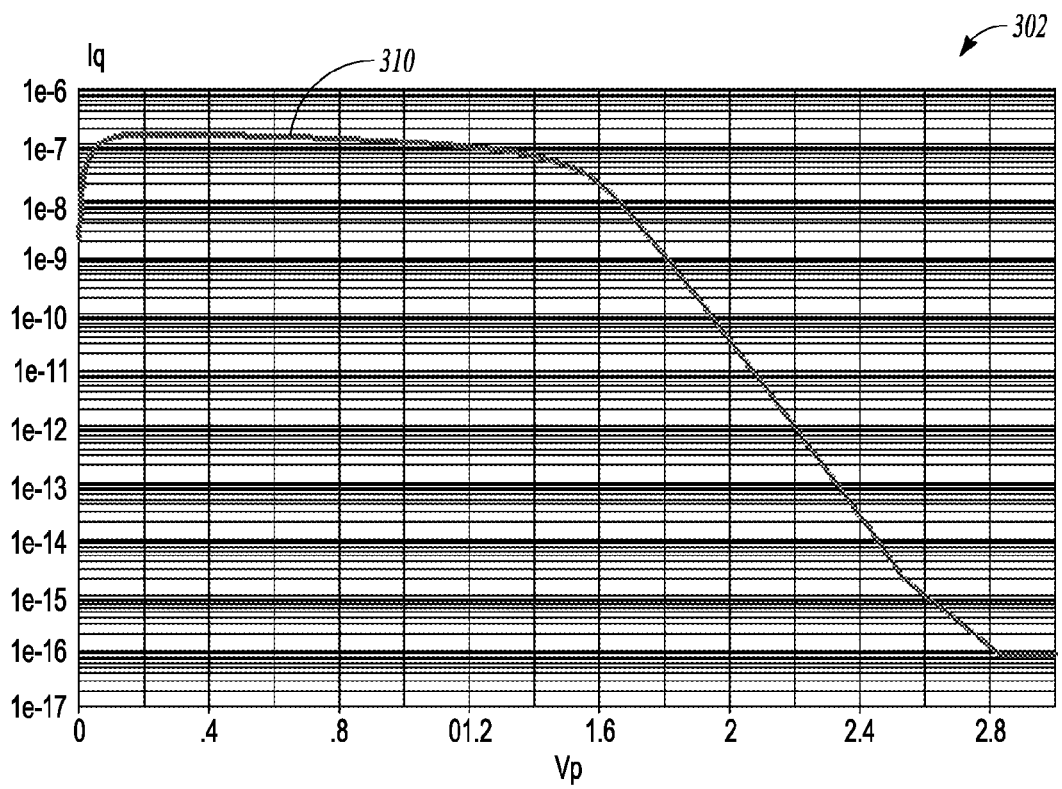
FIG. 3B is a plot of an example electrical characteristic of the embodiment of the pull-down circuit of FIG. 3A.

FIG. 3B is a plot 302 of an example current-voltage characteristic of the embodiment of the pull-down circuit 106B of FIG. 3A. The plot 302 illustrates the quiescent current Iq of the pull-down circuit 106B versus output voltage Vp. In the plot 302, the quiescent current Iq is represented by the vertical axis of plot 302. The output voltage Vp is represented by the horizontal axis of the plot 302. Line 310 of the plot 302 represents the quiescent current Iq as a graph with respect to the second power supply VS2. The quiescent current Iq and the output voltage Vp may correspond to the pull-down current and the pull-down voltage, respectively, of the pull-down circuit 106B. Since FIG. 3B illustrates aspects of the operation of the pull-down circuit 106B, FIG. 3B will be described with continued reference to FIG. 3A.

In operation, as stated, the gate of the transistor Mpj may conduct a pull-down current, such as Iq, and sense the output voltage Vp. As shown in the plot 302, the pull-down circuit 106B conducts the current Iq substantially independent of the voltage Vp for a range of voltages from nearly 0 V to nearly 1.6 V. For example, increasing the voltage Vp within this range may have the initial effect of increasing the gate-source voltage of the transistor Mpj. As a result, the operating point of the transistor Mpj may tend to shift closer towards pinch-off and reduce the current Iq. However, a reduced current Iq through the transistor Mn1 may increase the drain voltage (e.g., VDOWN) of the transistor Mn1. Accordingly, the gate-source voltage of Mpj may tend to decrease and the current Iq may tend to increase. In effect, the transistor Mn1 senses the current Iq conducted by the transistor Mpj and in response generates the voltage VDOWN, which is fed back to the transistor Mpj and adjusts Iq via the action of VGS of Mpj. This feedback loop formed by the transistor Mn1 adjusting the source voltage of Mpj based on the current Iq may substantially regulate the current Iq about an approximately constant level for a range of voltage Vp.

In the example shown in FIG. 3B, the pull-down circuit 106B has a peak current of about 230 nanoamperes (nA) at approximately 0.2 V. As Vp continues to increase, eventually the transistor Mpj begins to pinch-off since the transistor Mn1 does not increase the voltage VDOWN at the same rate as Vp. For example, the transistor Mpj begins pinching off at about 1.6 V and substantially shuts off for 1.8 V. It will be appreciated by one of ordinary skill in the art that alternative embodiments may have different current-voltage characteristics.

In one aspect, the pull-down circuit 106B may serve to detect whether a current exceeds a predetermined threshold. For example, the current Iq may correspond to a bias current provided to the node N1 by an external circuit (not shown). The predetermined threshold may correspond to the peak pull-down current of the pull-down circuit 106B. For example, if the provided current Iq is less than the peak pull-down current, then the pull-down circuit 106B may be configured to conduct the current Iq and to pull down the voltage Vp (e.g., to the voltage level of the power supply VS1). Alternatively, if the provided current Iq is greater than about the peak pull-down current, then the current Iq will cause the transistor Mpj to pinch off, thereby allowing the external circuit to drive the voltage VP high. Aspects of current detection will be described later in greater detail in connection with FIGS. 8 and 9.

Figure 4:
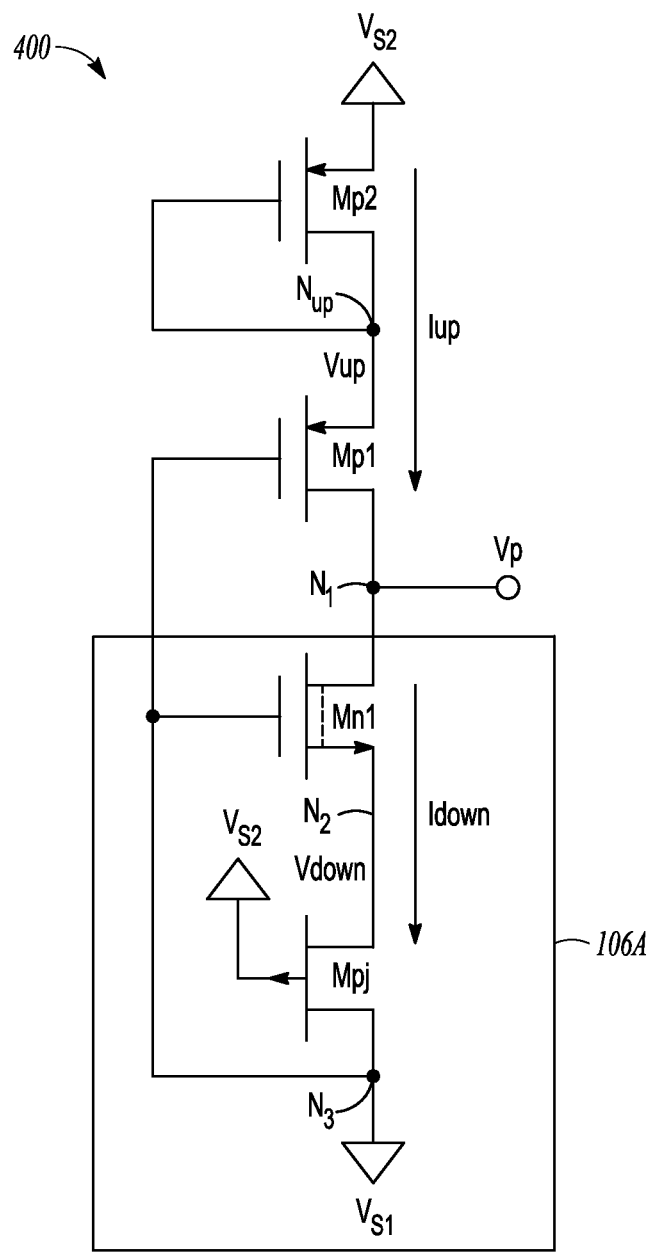
FIG. 4 is a schematic circuit diagram illustrating another example embodiment of a logic circuit including a pull-up circuit and a pull-down circuit.

FIG. 4 is a schematic circuit diagram illustrating another example embodiment of a logic circuit 400 including a pull-up circuit, such as the transistors Mp1 and Mp2, and a pull-down circuit 106A. The pull-down circuit 106A includes a transistor Mn1 and a transistor Mpj. The logic circuit 400 may be coupled to first and second power supplies VS1, VS2. Elements common to the schematics of FIGS. 2A and 4 share common reference indicia, and only differences between the schematics are described herein for the sake of brevity.

As described above in connection with FIGS. 2A and 2B, the pull-down circuit 106A is configured to pull down the voltage Vp at the node N1 if the second power supply VS2 is less than about a predetermined threshold Vth_sys of the logic circuit 400. As will be described in greater detail, the threshold Vth_sys is based at least partly on the characteristics of the transistors Mp1, Mp2 and the pull-down circuit 106A.

The pull-up circuit comprising transistors Mp1 and Mp2 is configured to pull up the voltage Vp if the second power supply VS2 is greater than about the predetermined threshold Vth_sys. For example, in the illustrated embodiment, the pull-up circuit has a first end configured to receive the second power supply VS2 and a second end operatively coupled to the first node N1. In particular, the transistor Mp2, being diode connected, has a source operatively coupled to the second power supply, a drain operatively coupled to a node Nup, and a source operatively coupled to the node Nup. Moreover, the transistor Mp1 has a source operatively coupled to the node Nup, a drain operatively coupled to the node N1, and a gate operatively coupled to the first power supply VS1. One skilled in the art will appreciate that in alternative embodiments, additional diode-connected transistors may be added in series with, or in place of, the transistor Mp2 in order to adjust the turn-over voltage Vth_sys. The additional transistors may correspond to, for example, n-channel and/or p-channel MOSFETs.

The threshold Vth_sys may be at least partly based on the thresholds of the transistors Mp1, Mp2, Mn1, Mpj. For instance, the equation Iup=Idown holds, wherein the pull-down current Idown can be approximated in accordance with the following equations based on the current models of the transistors Mpj and Mn1, respectively:

$$I_{down} \approx I_{pj0} \frac{W_{pj}}{L_{pj}} \exp\left(\frac{q(V_{thj} - (V_{S2} - V_{down}))}{n_{pj}kT}\right) \exp\left(\frac{qK_1 V_{down}}{kT}\right) \quad \text{(Eqn. 1a)}$$

$$\approx I_{n0} \frac{W_{n1}}{L_{n1}} \exp\left(\frac{q(-V_{down} - V_{thn})}{n_n kT}\right). \quad \text{(Eqn. 1b)}$$

The right-hand sides of Equations 1a and 1b may correspond to models of the current-voltage (I-V) characteristics of the transistor Mpj and the transistor Mn1, respectively, operating at the edge the sub-threshold regime. In Equations 10a and 1b, the parameter Ipj0 corresponds to the drain current of Mpj at VGS=Vth. The parameter In0 corresponds to the drain current of Mn1 at VGS=Vth. The parameters Wpj and Lpj correspond to the width and length, respectively, of the transistor Mpj. The parameters Wn1 and Ln1 correspond to the width and length, respectively, of the transistor Mn1. The parameter q corresponds to the charge of an electron (e.g., $1.6 \times 10^{-19}$ Coulomb). The parameter npj corresponds to the slope factor of the transistor Mpj. The parameter nn corresponds to the slope factor of the transistor Mn1. The parameter K1 corresponds to the subthreshold drain current knee factor of the transistor Mn1. The parameter kT corresponds to the product of the Boltzmann constant k and the temperature T.

Additionally, the pull-up current Iup can be approximated in accordance with the following equations based on the current models of the transistors Mp1 and Mp2, respectively:

$$I_{up} \approx I_{p0} \frac{W_{p1}}{L_{p1}} \exp\left(\frac{q(V_{up} - V_{thp})}{n_p kT}\right) \quad \text{(Eqn. 2a)}$$

$$\approx I_{p0} \frac{W_{p2}}{L_{p2}} \exp\left(\frac{q(V_{S2} - V_{up} - V_{thp})}{n_p kT}\right). \quad \text{(Eqn. 2b)}$$

The right-hand sides of Equations 2a and 2b may correspond to models of the I-V characteristics of the transistors Mp1 and Mp2, respectively, operating at the edge of the sub-threshold regime. In Equations 2a and 2b, the parameter Ip0 corresponds to the drain current of Mp1 and Mp2 at VGS=Vth. The parameters Wp1 and Lp1 correspond to the width and length, respectively, of the transistor Mp1. The parameters Wp2 and Lp2 correspond to the width and length, respectively, of the transistor Mp2. The parameter np corresponds to the slope factor of the transistors Mp1, Mp2.

The voltage VDOWN may be approximated by equating the right-hand sides of Equations 1a and 1b and solving for VDOWN. Similarly, the voltage Vup may be approximated by equating the right-hand sides of equation 2a and 2b and solving for Vup. Accordingly, VDOWN and Vup may be approximated in accordance with the following equations:

$$V_{down} \approx \frac{\frac{V_{S2} - V_p}{n_{pj}} - \frac{V_{thn}}{n_n} + V_T \ln \frac{W_n L_p I_n}{W_p L_n I_{pj}}}{\frac{1}{n_{pj}} + \frac{1}{n_n} + K_1} \quad \text{(Eqn. 3)}$$

$$V_{up} \approx \frac{V_{S2}}{2} + \frac{1}{2} n_p V_T \ln \frac{W_{p2} L_{p1}}{W_{p1} L_{p2}}. \quad \text{(Eqn. 4)}$$

In Equations 3 and 4, the parameter VT corresponds to the thermal voltage Kt/q. Furthermore, because Iup should be equal to Idown when the power supply Vs2 reaches approximately the turnover voltage Vth_sys, the turnover voltage Vth_sys may be expressed by substituting Equations 3 and 4 into Equations 1b and 2a with the condition that Iup=Idown. For the sake of simplicity, Equation 5 shown below is simplified by assuming that npj=nn=np=1; K1=0; Ip0=Ipj0=In0; and the transistors Mn1, Mpj, Mp1, and Mp2 are all the same sizes.

$$V_{s2} = V_{the\_sys} \approx V_{thp} + \frac{V_p - V_{thn}}{2}. \quad \text{(Eqn. 5)}$$

Accordingly, Equation 5 illustrates that the effects of temperature variations may be attenuated. For example, a rise of temperature T may cause Vthp, Vth,n, and Vp to decrease. Because the Vth_sys depends on a difference of Vp and Vthn, the net effect of temperature on Vth_sys may be reduced.

Figure 5:
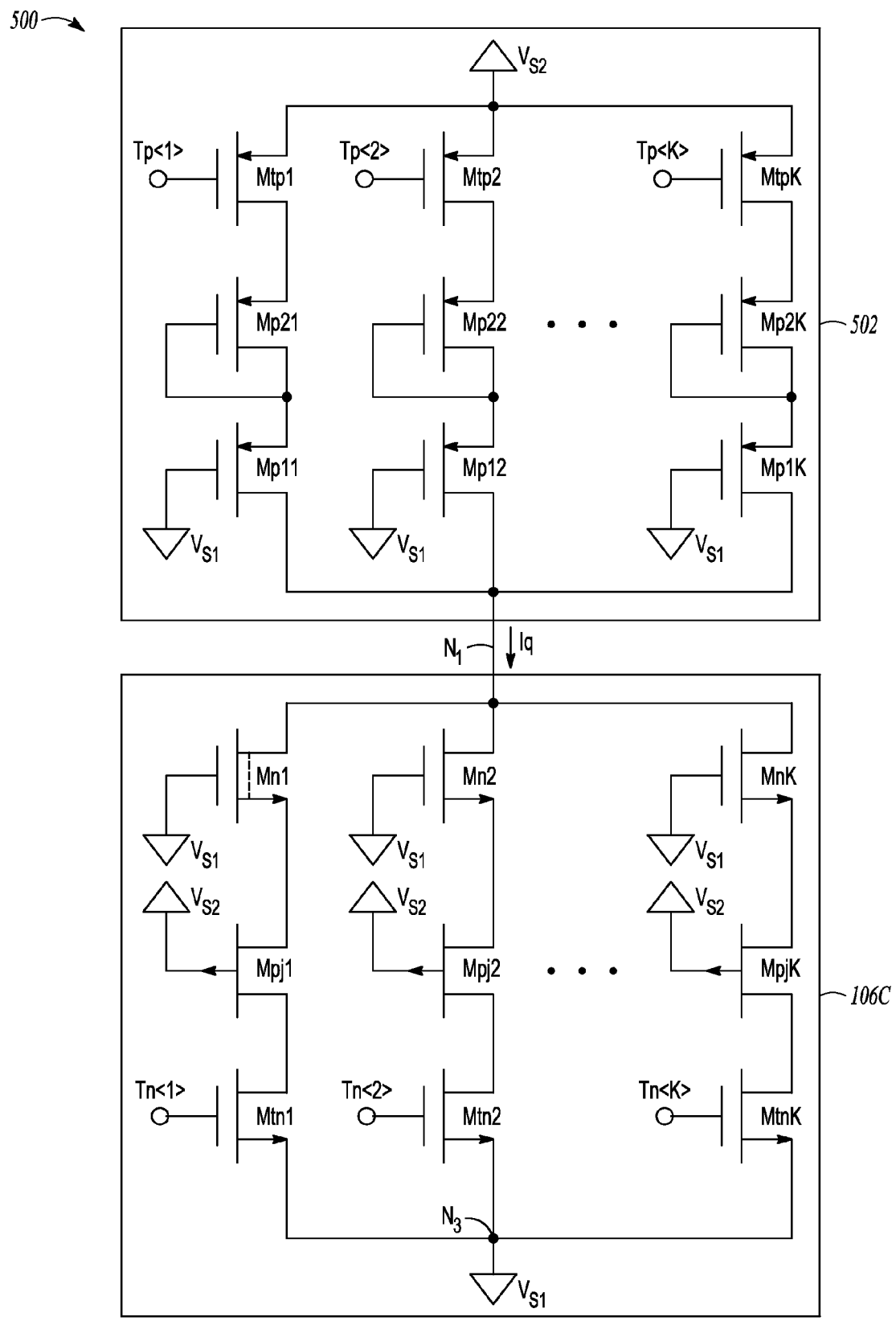
FIG. 5 is a schematic circuit diagram illustrating another example embodiment of a logic circuit including a pull-up circuit and a pull-down circuit.

FIG. 5 is a schematic circuit diagram illustrating an example embodiment of a logic circuit 500 including a pull-up circuit 502 and a pull-down circuit 106C. In the illustrated embodiment, the pull-up circuit 502 and the pull-down circuit 106C are each configurable in order to adjust the trim settings of the logic circuit 500. As will be described in greater detail below, the pull-up circuit 502 has a parallel structure comprising multiple sub-pull-up circuits that may be selectively activated. In addition, the pull-down circuit 504 has a parallel structure comprising multiple sub-pull-down circuits that may be selectively activated. Changing the activation of the pull-up circuit 502 and/or the pull-down circuit 106 can be serve to adjust the turn-over voltage Vth_sys of the logic circuit 500.

In the illustrated embodiment, the pull-up circuit 502 includes transistors Mtp1, Mtp2, . . . , MtpK, Mp11, Mp12, . . . , Mp1K, Mp21, Mp22, . . . , Mp2K. The pull-down circuit 106C includes transistors Mn1, Mn2, . . . , MnK, Mpj1, Mpj2, . . . , MpjK, Mtn1, Mtn2, . . . , MtnK. Elements common to the schematics of FIGS. 4 and 5 share common reference indicia, and only differences between the schematics are described herein for the sake of brevity. For example, each pair of transistors (Mp1$i$, Mp2$i$), for i=1, . . . , K, may correspond to the transistor pair (Mp1, Mp2) of FIG. 4. Moreover, each pair of transistors (Mn$i$, Mpj$i$), for i=1, . . . , K, may correspond to the transistor pair (Mn1, Mpj) of FIG. 4.

The transistors Mtp1, Mtp2, . . . , MtpK may correspond to p-channel MOSFETs and transistors Mtn1, Mtn2, MtnK may correspond to n-channel MOSFETs. The transistors Mtpi, Mtni may serve as switches. A person skilled in the art will recognize that in alternative embodiments that the transistors Mtp1, Mtp2, . . . , MtpK, Mtn1, Mtn2, MtnK may be any suitable device configured to selectively switch on and off.

The pull-up circuit 502 is operatively coupled to a power supply VS2 at one end and a node N1 at another end. The pull-down circuit 106C is operatively coupled to node N1 at one end and a power supply VS1 at another end. Moreover, the pull-up circuit 502 is configured to receive signals Tp<1>, Tp<2>, . . . , Tp<K>. The pull-down circuit 106C is configured to receive signals Tn<1>, Tn<2>, . . . , Tn<K>. As will be described in greater detail, in the example embodiment, the signals Tp<1>, Tp<2>, . . . , Tp<K> and/or the signal Tp<1>, Tp<2>, . . . , Tp<K> may serve to trim the pull-up and/or pull-down circuits 502, 106C. Trimming the pull-up circuits 502 and/or the pull-down circuit 106C may, e.g., adjust at least one of the turn-over voltage, pull-down current Iq, and the like characteristics of the logic circuit 500 and/or may reduce sensitivity to process and variations. The trimming aspects of the pull-up and pull-down circuits 502, 106C will be described in greater detail below.

The pull-up circuit 502 includes K parallel branches, each branch configured to selectively open or close based on the respective signals Tp<1>, Tp<2>, . . . , Tp<K>. For example, the transistors Mtp1, Mp11, Mp21 may form a first branch of the pull-up circuit 502. Likewise, the arrangement including the transistors Mtp2, Mp12, Mp22 and the arrangement including the transistors MtpK, Mp1K, Mp2K each form respective branches. As illustrated, the transistor Mtp1 has a source operatively coupled to the power source VS2, a drain operatively coupled to the interconnection of the transistors Mp11, Mp21, and a gate configured to receive a signal Tp<1>. The transistor Mtp1 may be configured to turn on and off selectively based on the signal Tp<1>. When the transistor Mtp1 is switched on, the transistors Mp11, Mp21 may operate in a manner similar to the transistors Mp1, Mp2 of FIG. 4. Additionally, each of the other K branches may be turned on or off based on the respective signals Tp<1>, . . . , T<K>.

Accordingly, the logic circuit 500 may be trimmed by activating (e.g., switching on the corresponding transistor Mtpi) one or more of the branches of the pull-up circuit 502. For example, the pull-up circuit 502 may be configured to trim the logic circuit 500 based on the number of activated branches of the pull-up circuit 502. For example, increasing the number of activated branches may decrease the turnover voltage Vth_sys of the logic circuit 500. Accordingly, the signals Tp<1>, Tp<2>, . . . , Tp<K> may be provided in a manner that achieves a trim point by activating a certain number of the branches of the pull-up circuit 502 in parallel.

In one embodiment, each of the transistors Mp11, . . . Mp12, . . . , Mp1K may be similarly sized and/or each of the transistors Mp21, . . . Mp22, . . . , Mp2K may be similarly sized. In this way, the trim point may be based at least partly on the number of activated branches of the pull-up circuit 502. Moreover, the trim point may vary linearly with respect to the number of activated branches of the pull-up circuit 502. However, one skilled in the art will recognize that, in alternative embodiments, the transistors pairs (Mp1$i$, Mp2$i$) may be sized non-uniformly with respect to the branches. For example, the transistors pairs (Mp1$i$, Mp2$i$) may be sized such that each subsequent branch of the pull-up circuit 106C may have an increasingly greater effect on the trim point. In other words, activating the i$^{th}$ branch may have a larger effect than activating the (i-1)$^{th}$ branch and may have a lesser effect than activating the (i+1)$^{th}$ branch. In this way, increasing the number of activated branches of the pull-up circuit 502 may increase the trim point nonlinearly (e.g., geometrically or exponentially). It will be understood that the branches of the pull-up circuit 502 need not be ordered by the magnitude of their effects on the trim point of the logic circuit 500, and that the branches of the pull-up circuit 502 may be physically laid out in any suitable configuration.

In another embodiment, the logic circuit 500 may be configured to set the trim point based on switching in a selected one of the branches of the pull-up circuit 502, rather than the number of parallel activated branches. For example, each of the transistor pairs (Mp1$i$, Mp2$i$) may be sized to produce a particular trim setting (e.g., turnover voltage Vth_sys) that would result if the branch of the transistor pair (Mp1$i$, Mp2$i$) were switched on and the other branches switched off. For example, the transistor pair (Mp11, Mp21) may be sized to generate a first trim point 1, the transistor pair (Mp12, Mp22) may be sized to generate a second trim point 2, and so on. Accordingly, to achieve the ith trim point, the logic circuit or an external circuit (not shown) may activate the signal Tp<i> while deactivating the other signals of Tp.

The pull-down circuit 106C of the logic circuit 500 may include one or more branches interconnected in parallel that may be switched on and off selectively based on the signals Tn<1>, Tn<2>, . . . , Tn<K>. For example, the transistors Mtn1, Mn1, Mpj1 may form a first branch of the pull-down circuit 106C. Likewise, the arrangement including the transistors Mtn2, Mpj2, Mn2 and the arrangement including the transistors MtnK, MnK, MpjK each form respective branches. As illustrated, for i=1, . . . , K, the interconnection of the transistors Mpji, Mni has a first end coupled to the node N1 and a second end operatively coupled to the transistor Mtni. For example, the transistor Mni has a drain operatively coupled to the node N1, a source operatively coupled to the source of the transistor Mpji, and a gate operatively coupled to the power supply VS1. Additionally, the transistor Mpji has a drain operatively coupled to the drain of the transistor Mtni and a gate operatively coupled to the power supply VS2. The source of the transistor Mtni is operatively coupled to the power supply VS1. The gate of the transistor Mtni is configured to receive the signal Tn<i>. As such, the transistor Mtni may serve as a switch disposed between the arrangement of the transistor pair (Mni, Mpji) and the power supply Vs1. When the transistor Mtni is switched on, the transistor pair (Mpji, Mni) may operate in a manner similar to the transistors Mn1, Mpj of FIG. 4.

Accordingly, the logic circuit 500 may be trimmed by activating (e.g., switching on the corresponding transistor Mtni) one or more of the branches of the pull-down circuit 106C. For example, the turnover voltage Vth_sys of the logic circuit 500 may be increased by increasing the pull-down capability of the pull-down circuit 106C by increasing the number of activated branches and/or switching larger capacity transistors. As described above in connection with the pull-up circuit 502, the transistor pairs (Mni, Mpji) may be uniformly sized across the branches, or may be sized differently for one or more of the branches. Additionally, the selection may be based on selecting the number of the branches that are activated in parallel or based on the branch corresponding to the trim condition.

Figure 6:
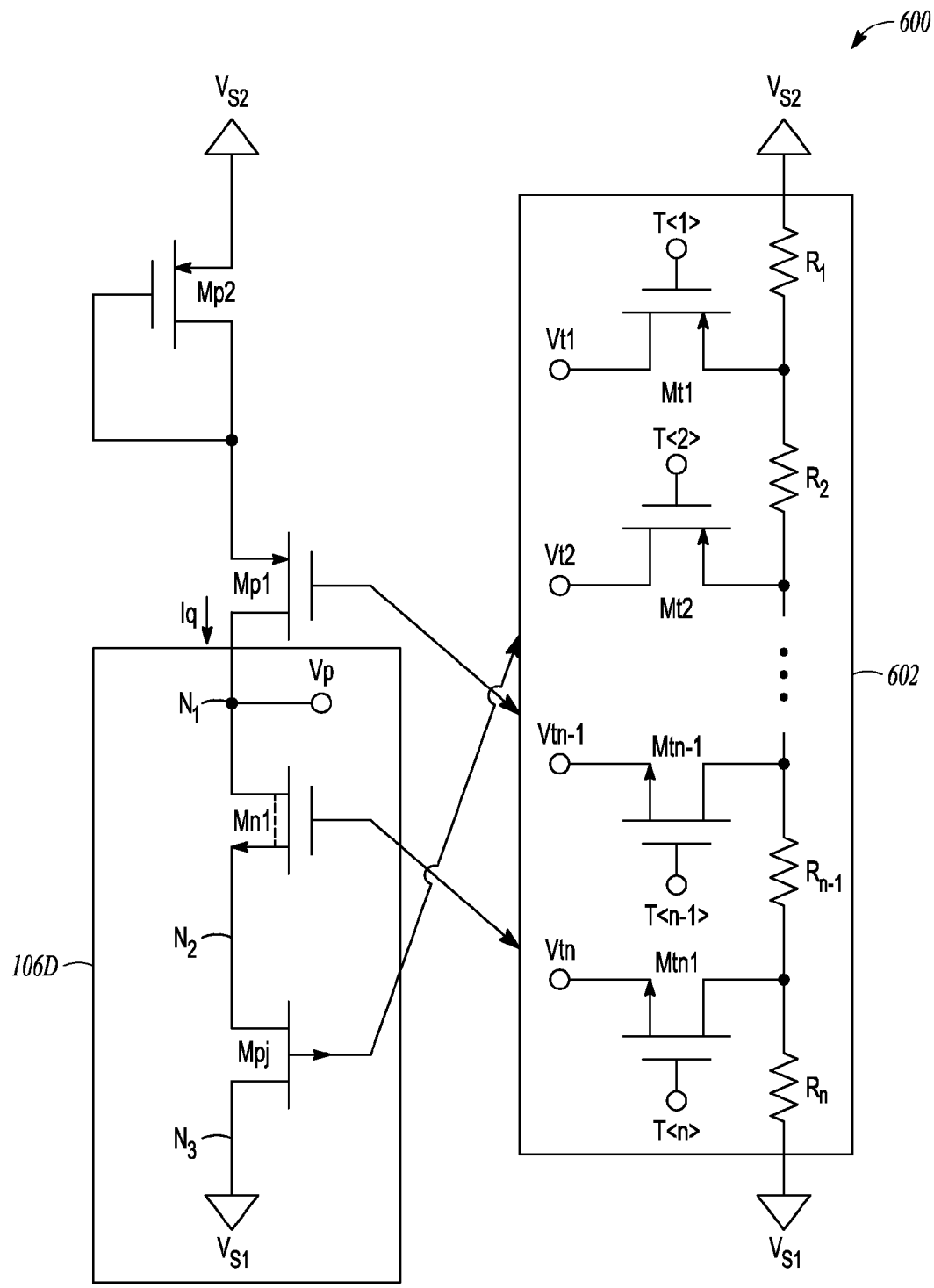
FIG. 6 is a schematic circuit diagram illustrating another example embodiment of a logic circuit including a pull-up circuit, a pull-down circuit, and a trimming circuit.

FIG. 6 is a schematic circuit diagram illustrating an example embodiment of another logic circuit 600 including a pull-up circuit, such as the transistors Mp1 and Mp2, a pull-down circuit 106D, and a trimming circuit 602. The pull-down circuit 106D includes transistors Mn1 and Mpj. The trimming circuit 602 includes a plurality of transistors Mt1, Mt2, Mtn-1, Mtn and resistors R1, R2, . . . , Rn-1, Rn. The logic circuit 600 may be coupled to first and second power supplies VS1, VS2. Elements common to the schematics of FIGS. 4 and 6 share common reference indicia, and only differences between the schematics are described herein for the sake of brevity. For example, the pull-up circuit and the pull-down circuit 106D mar correspond to the logic circuit 400 of FIG. 4 with the gates of the transistors Mp1, Mn1, Mpj operatively coupled to the trimming circuit 602.

The trimming circuit 602 may correspond to circuitry which may be configured to provide a plurality of bias voltages Vt1, Vt2, ..., Vtn−1, Vtn selectively based on the signals T<1>, T<2>, ..., T<n−1>, T<n>. The bias voltages may be provided to the pull-up circuit and/or the pull-down circuit 106D for changing the trim point of the logic circuit 600. In the illustrated embodiment, the resistors R1, R2, Rn−1, Rn of the trimming circuit 602 may be connected in series with a first end operatively coupled to the power supply VS2 and a second end operatively coupled to the power supply VS1. As such, the resistors R1, R2, Rn−1, Rn may serve as a voltage divider for generating voltages intermediary to the power supplies VS2, VS1. Although the trimming circuit 602 is described herein as including a resistor voltage divider, one skilled in the art will appreciate that in alternative embodiments other types of voltage dividers (such as any suitable passive or active impedance voltage divider) and circuits suitable for generating reference voltages (e.g., bandgap voltage reference circuits or voltage regulators) may be used.

The transistors Mt1, Mt2, ..., Mtn−1, Mtn may serve to selectively provide the voltages Vt1, Vt2, ..., Vtn−1, Vtn generated by the voltage divider 602 and provided to the pull-up circuit and/or the pull-down circuit 106D. For example, the transistors Mt1, Mt2 have sources operatively coupled to respective nodes of the voltage divider 602 and a gate configured to receive respective signals T<1>, T<2> for switching the transistors Mt1, Mt2 selectively on and off. Furthermore, in the illustrated embodiment, the gate of the transistor Mpj of the pull-down circuit 106D is operatively coupled to the trimming circuit 602 for receiving one of Vt1 or Vt2. For example, in operation, one of the transistors Mt1, Mt2 may be switched on, and the other switched off, in order to provide the corresponding voltage Vt1, Vt2 to the gate of Mpj. Alternatively, both transistors Mt1, Mt2 may be switched off and the gate of the transistor Mpj may be configured to operatively couple to the power supply VS2.

Likewise, the transistors Mtn−1, Mtn have sources operatively coupled to respective nodes of the voltage divider 602 and gates configured to receive respective signals T<1>, T<2> for switching the transistors Mtn−1, Mtn selectively on and off. Furthermore, in the illustrated embodiment, the gates of the transistors Mn1 of the pull-down circuit 106D and the transistor Mp1 of the pull-up circuit are operatively coupled to the trimming circuit 602 for receiving one of Vtn−1 or Vtn. For example, in operation, one of the transistors Mtn−1, Mtn may be switched on, and the other transistor switched off, in order to provide the corresponding voltage Vtn−1, Vtn to the gates of the transistor Mp1 and/or Mn1. Alternatively, both transistors Mtn−1, Mtn may be switched off and the gates of the transistors Mp1 and/or Mn1 may be configured to operatively couple to the power supply VS1. One skilled in the art will appreciate that in alternative embodiments the gates of the transistors Mp1 and Mn1 may be switched independently to different nodes of the trimming circuit 602. For example, the gate of the transistor Mp1 may receive at least one of the voltages Vtn−1, Vtn, or VS1 based on the state of one or more switches (e.g., transistor s Mtn−1 or Mtn) of the trimming circuit 602, and the gate of the transistor Mn1 may receive at least one of the voltages Vtn, Vtn−1, or VS1 based on the state of one or more switches (e.g., transistors Mtn−1 or Mtn) of the trimming circuit 602.

Example Voltage Detection Applications

Figure 7A:
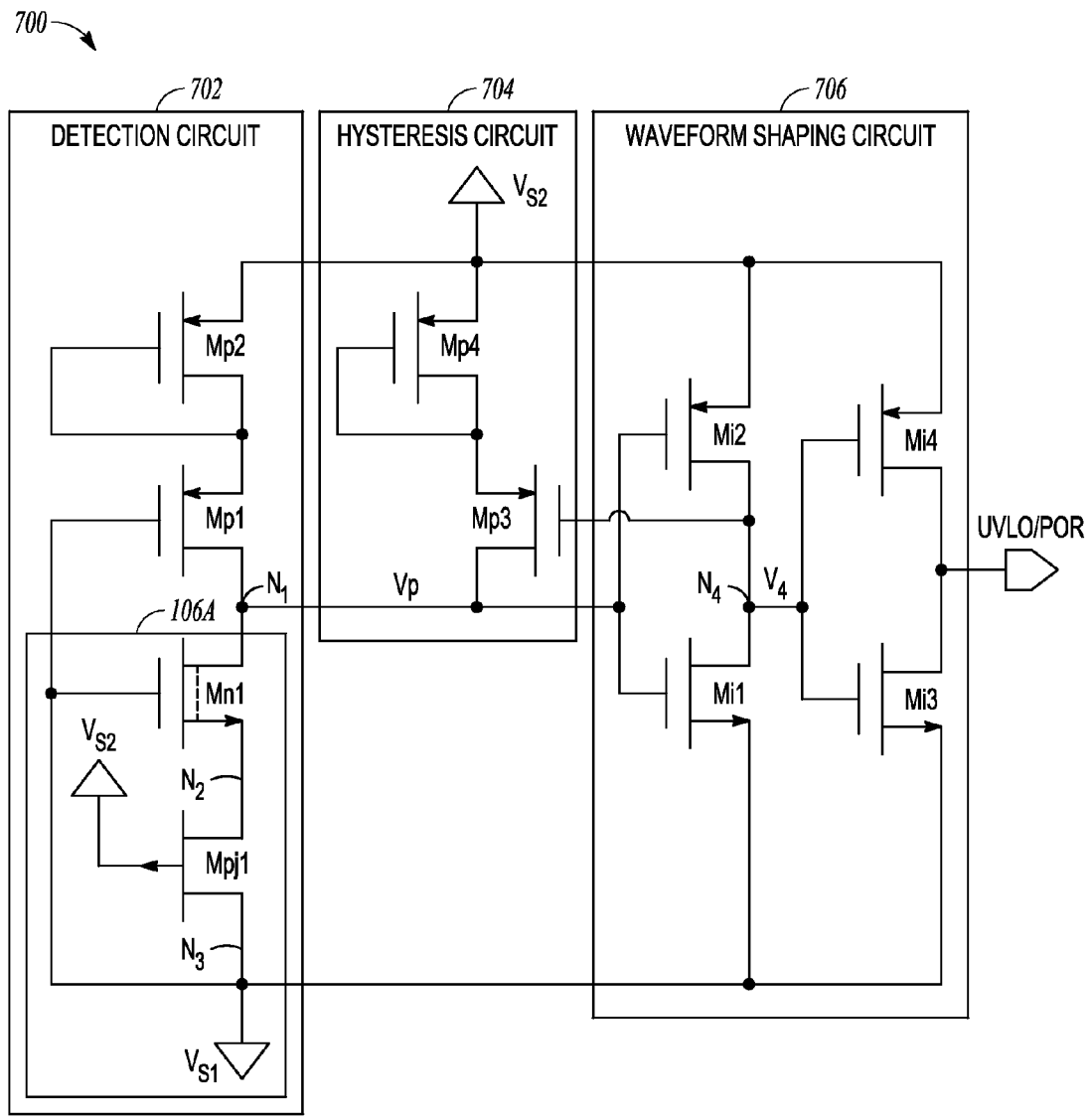
FIG. 7A is a schematic circuit diagram illustrating another example embodiment of a logic circuit including a pull-down circuit of FIG. 1.

FIG. 7A is a schematic circuit diagram illustrating another example embodiment of a logic circuit 700 including a pull-down 106A circuit of FIG. 1. The logic circuit 700 includes a detection circuit 702, a hysteresis circuit 704, and a waveform shaping circuit 706. The detection circuit 702 includes a pull-up circuit, such as a circuit formed by transistors Mp1, Mp2, and the pull-down circuit 106A. The pull-down circuit 106A includes transistors Mn1, Mpj. The hysteresis circuit 704 includes transistors Mp3, Mp4. The waveform shaping circuit 706 includes transistors Mi1, Mi2, Mi3, Mi4. Elements common to the schematics of FIGS. 4 and 7A share common reference indicia, and only differences between the schematics are described herein for the sake of brevity.

In example embodiments, the logic circuit 700 may correspond to an undervoltage lockout (UVLO) circuit and/or a power-on-reset (POR) circuit. An example of an UVLO circuit includes an electronic device configured to monitor a power supply and to signal when the power supply drops below a predetermined threshold. For example, the logic circuit 700 may be configured to determine whether the power supply VS2 is below a threshold and assert the signal UVLO/POR low if it is determined that the power supply VS2 is below the threshold. Asserting the signal UVLO/POR low may shut off external circuitry (not shown), thus protecting the external circuitry and associated devices. An example of a POR circuit includes an electronic device configured to monitor a power supply to a circuit and to generate a reset signal that places the circuit in a known state. While although the logic circuit 700 is described in the context of serving as an UVLO circuit and/or a POR circuit, one skilled in the art will appreciate that the logic circuit 700 may be embodied in other types of applications for monitoring or detecting a voltage level.

As will be described in greater detail below in connection with FIG. 7B, the logic circuit 700 may be configured to receive the power supply VS2 as an input and to generate a signal UVLO/POR as an output. For example, the logic circuit 700 may be configured to generate the signal UVLO/POR such that the signal UVLO/POR is asserted low (e.g., approximately VS1) if the power supply VS2 is below a first threshold VL. If the power supply VS2 is above a second threshold VH, then the logic circuit 700 may be configured to generate the signal UVLO/POR such that the signal UVLO/POR is asserted high (e.g., approximately VS2). In various embodiments, the first and second thresholds may be the same or may be different thresholds. For example, as described in greater detail below in connection with the hysteresis circuit 704, the first threshold may be less than the second threshold.

The detection circuit 702 may include circuitry configured to receive the power supply VS2 as an input and to generate a voltage Vp at the node N1 as an output. In particular, as stated, the detection circuit 702 may operate in a manner as described in connection with the logic circuit 400 of FIG. 4. In particular, the pull-up circuit has a first end configured to receive the power supply VS2 and a second end operatively coupled to the node N1. The pull-down circuit 106A has a first operatively coupled to the node N1, a second end operatively coupled to the power supply VS1, and a third end operatively coupled to the power supply VS2. As the power supply VS2 increases from 0 V relative to the power supply VS1, the pull-down circuit 106A is configured to set the voltage Vp of the node N1 to approximately VS1 until the power supply VS2 is greater than approximately the upper threshold VH. For example, the upper threshold VH may correspond to the turnover voltage Vth_sys as described above in connection with FIG. 4. As the power supply VS2 (relative to VS1) becomes greater than VH, the pull-up circuit will pull up the voltage Vp of the node N1.

The hysteresis circuit 704 may correspond to circuitry configured to decrease the turnover voltage Vth_sys of the detection circuit 702 if the voltage Vp is pulled up. For example, the hysteresis circuit 704 has a first end operatively coupled to the power supply VS2 and a second end operatively coupled to the node N1. In the illustrated embodiment, for example, the transistor Mp3 of the hysteresis circuit 704 corresponds to a p-channel MOSFET having a drain operatively coupled to the node N1, a source operatively coupled to the drain and gate of the transistor Mp4, and a gate operatively coupled to the waveform shaping circuit 706. The transistor Mp4 of the hysteresis circuit 704 corresponds to a p-channel MOSFET further having a source operatively coupled to the power supply VS2. As will be described in greater detail in connection with the waveform shaping circuit 706, if the node N1 is pulled down, then the gate of the Mp3 is pulled high and thus the transistor Mp3 is turned off. Accordingly, the hysteresis circuit 704 may have substantially no effect on the turn over voltage of the detection circuit 702. Alternatively, if the node N1 is pulled up, then the gate of the Mp3 is pulled low and thus the transistor Mp3 is turned on. In this case, the hysteresis circuit 704 acts in parallel with the pull-up circuit of the detection circuit 702. Thus, in order for the pull-down circuit 106A to pull down the node N1 if the node N1 is pulled high, the pull-down circuit 106A should to overcome both the pull-up circuit and the hysteresis circuit 704. Accordingly, the turn over voltage to pull down the node N1 from a high state is a lower threshold VL than VH.

The waveform shaping circuit 706 corresponds to circuitry configured to generate the signal UVLO/POR in accordance with one or more logic levels. For example, the waveform shaping circuit 706 is configured to receive the voltage Vp as an input and to generate the signal UVLO/POR as an output. In particular, the transistors Mi1, Mi2 form a first complementary MOSFET (CMOS) inverter configured to receive Vp as an input and to generate a voltage V4 as an output. The transistors Mi3, Mi4 form a second CMOS invertor configured to receive the voltage V4 as an input and to generate the signal UVLO/POR as an output. In other words, the first and second CMOS invertors are cascaded together. Accordingly, the signal UVLO/POR may take on a value of a high logic level (e.g., VS2) or a low logic level (e.g., VS1). It will be appreciated by one skilled in the art that in alternative embodiments the waveform shaping circuit 706 may include more or less stages of invertors.

Additionally, the output V4 of the first CMOS inverter is fed back to the gate of the hysteresis circuit 704. Accordingly, the waveform shaping circuit 706 is configured to activate the hysteresis circuit 704 if the node N1 is pulled high and is further configured to deactivate the hysteresis circuit 704 if the node N1 is pulled low. As stated, if the hysteresis circuit is activated, then the hysteresis circuit 704 reduces the turnover voltage Vth_sys of the detection circuit 702.

Figure 7B:
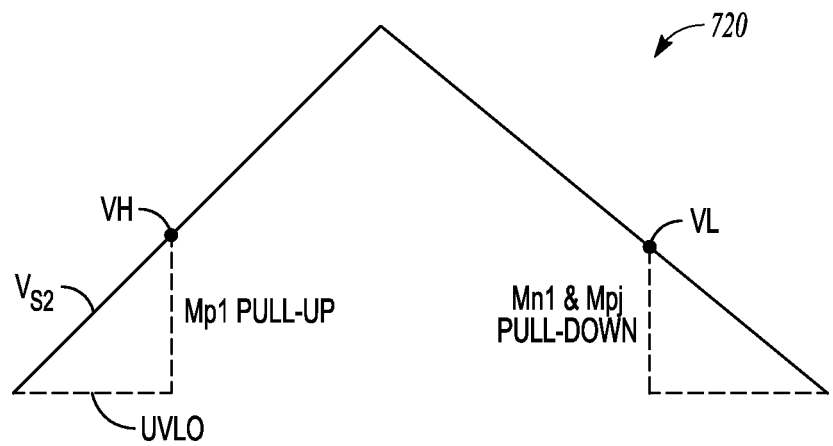
FIG. 7B is a plot illustrating an example input-output relationship of the example embodiment of the power supply detection system of FIG. 7A.

FIG. 7B is a plot 720 illustrating an example input-output relationship of the embodiment of the logic circuit 700 of FIG. 7A. The plot 720 includes the power supply VS2 represented by a solid line and the signal UVLO (or, e.g., POR) represented by a dashed line. In the illustrated embodiment, the power supply VS2 is increased for a period of time and then decreased for a period of time, thereby forming a triangular waveform. As the power supply VS2 is initially increased (relative to VS1), the logic circuit 700 generates the output UVLO at a logic low value. Additionally, the plot 720 shows that if the power supply VS2 exceeds the threshold VH, the logic circuit 700 generates the output UVLO at a logic high value. For example, the signal UVLO is pulled up to approximately the value of the power supply VS2. The logic circuit 700 is configured to maintain the signal UVLO at a logic high value until the power supply VS2 drops below the threshold VL. For VS2 below the threshold VL, the logic circuit 700 is configured to generate the signal UVLO at low logic value. The plot 720 shows that the threshold VH is greater than the threshold VL, due to the effect of the hysteresis circuit 704, as stated above in connection with FIG. 7A.

Example Current Detection Applications

Figure 8:
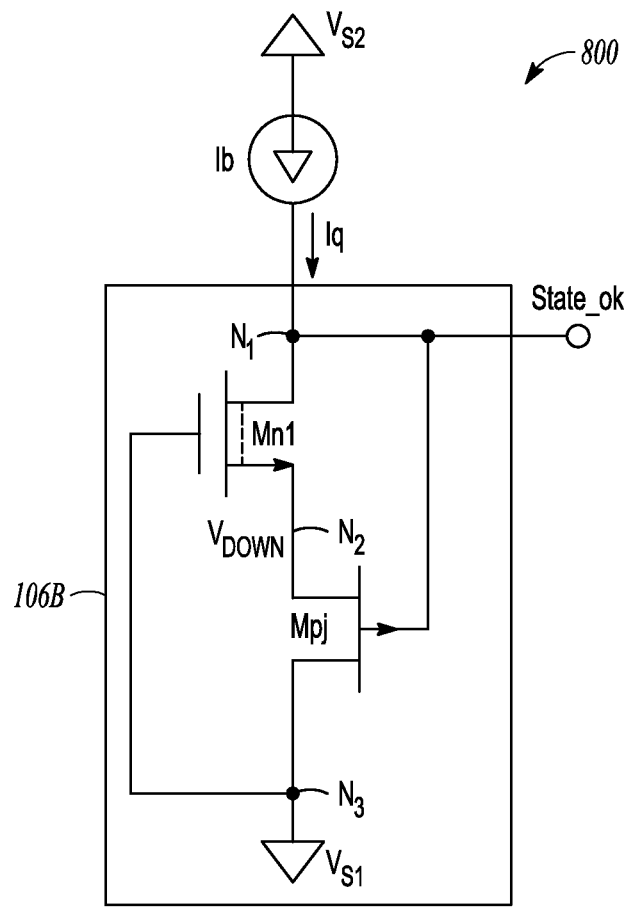
FIG. 8 is a schematic circuit diagram illustrating another example embodiment of a power supply detection system including a pull-down circuit of FIG. 1.

FIG. 8 is a schematic circuit diagram illustrating another example embodiment of a logic circuit 800 including a pull-down circuit 106B of FIG. 1. The logic circuit 800 further includes a current source Ib interconnected with the pull-down circuit 106B. Elements common to the schematics of FIGS. 3A and 8 share common reference indicia, and only differences between the schematics are described herein for the sake of brevity.

As described above in connection with FIGS. 3A and 3B, the pull-down circuit 106B may serve to detect whether the current Iq received at the node N1 is greater than a predetermined threshold. For example, the predetermined threshold may correspond to the peak pull-down current of the pull-down circuit 106B. If the current Iq provided to the node N1 by the current source Ib is less than approximately the peak pull-down current, then the pull-down circuit 106B is configured to sink the current and pull down the node N1 to produce the signal State_ok at a low level (e.g., approximately VS1). Alternatively, if the current source Ib is configured to generate the current Iq at a level that is greater than approximately the peak pull-down current of the pull-down circuit 106B, then the pull-down circuit 106B deactivates and generates the signal State_ok at a high level (e.g., approximately VS2). As a result, since the transistor Mpj becomes pinched off due to the voltage Vp of node N1 being pulled up, the pull-down circuit 106B conducts substantially zero quiescent current.

Figure 9:
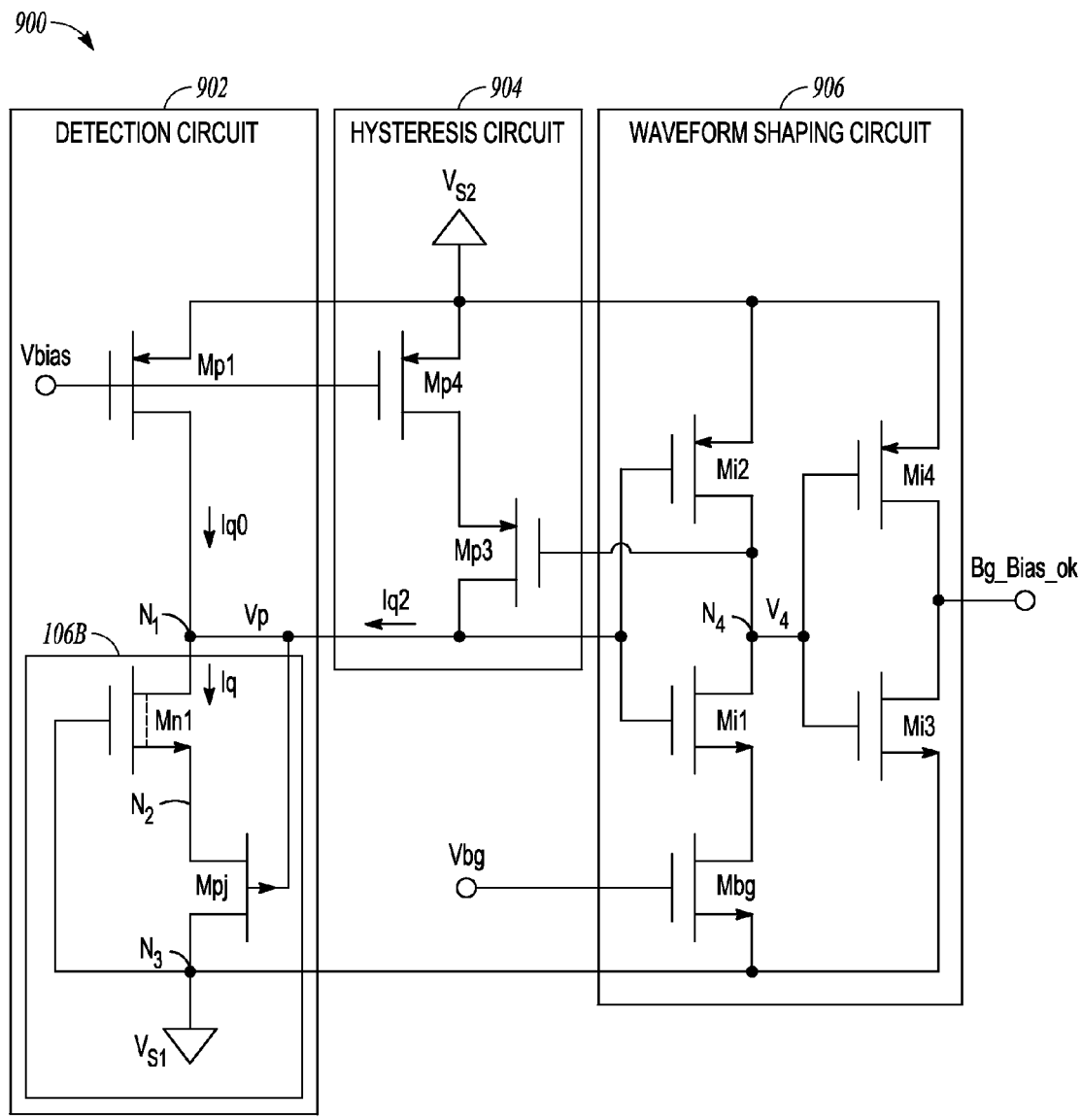
FIG. 9 is a schematic circuit diagram illustrating another example embodiment of a power supply detection system including a pull-down circuit of FIG. 1.

FIG. 9 is a schematic circuit diagram illustrating another example embodiment of a logic circuit 900 including a pull-down circuit 106B of FIG. 1. The logic circuit 900 includes a detection circuit 902, a hysteresis circuit 904, and a waveform shaping circuit 906. The detection circuit 902 includes a pull-up circuit, such as a circuit comprising a transistor Mp1, and the pull-down circuit 106B. The pull-down circuit 106B includes transistors Mn1, Mpj. The hysteresis circuit 904 includes transistors Mp3, Mp4. The waveform shaping circuit 906 includes transistors Mi1, Mi2, Mi3, Mi4, Mbg. Elements common to the schematics of FIGS. 3A and 8 share common reference indicia, and only differences between the schematics are described herein for the sake of brevity.

In example embodiments, the logic circuit 900 may correspond to a bias-ok detector. An example of a bias-ok detector includes an electronic device configured to monitor a bias signal, such as a bias current and/or voltage, and to signal when the bias signal is above or below a predetermined threshold. For example, the logic circuit 900 may be configured to determine whether the bias current Iq of FIG. 8 is within an acceptable range. If the bias current Iq is determined to be outside the acceptable range, the logic circuit 900 may be configured to assert the signal Bg_Bias_ok low, thereby signaling that the current Iq is outside the acceptable range. The output Bg_Bias_ok may shut off an external circuit (not shown) if asserted low. Alternatively, the Bg_Bias_ok signal may be provided to a feedback circuit that may be configured to adjust the current Iq based on the signal Bg_Bias_ok. While the logic circuit 900 is described herein in the context of serving as a bias-ok detector, one skilled in the art will appreciate that the logic circuit 900 may correspond to any suitable application involving monitoring or detecting a current and/or voltage levels.

The logic circuit 900 may be configured to receive the power supply VS2, a signal Vbias, and a signal Vbg as inputs, and may be further configured to generate a signal Bg_Bias_ok as an output. The signal Vbias may correspond to a gate voltage generated by at least a portion of a current mirror (not shown) for replicating a system bias current. That is, the signal Vbias biases the transistor Mp1 for generating the current Iq0, which may correspond to a replicated or scaled version of the system bias current. The signal Vbg may correspond to a bias voltage of a bottom gate of a power regulator (not shown) or an output voltage of a bandgap voltage reference circuit (not shown).

The logic circuit 900 may be configured to generate the signal Bg_Bias_ok such that the signal Bg_Bias_ok is asserted low if the current Iq is less than a threshold Ith or if Vbg is less than a threshold Vthbg. The threshold Ith may correspond to a peak pull-down current of the pull-down circuit 106B, as was described in greater detail in connection with FIGS. 3A and 3B. The threshold Vthbg may correspond to a threshold voltage Vthn of the transistor Mbg. Furthermore, the logic circuit 900 may be configured to assert the signal Bg_Bias_ok high if the current Iq is greater than the threshold Ith and if Vbg is greater than the threshold Vthbg. Additionally, in this case, the logic circuit 900 may be configured to reduce threshold Ith by an offset via the hysteresis circuit 904, as will be described below in greater detail, in order to prevent chattering of the signal Bg_Bias_ok.

The detection circuit 902 may include circuitry configured to receive the power supply VS2 as an input and to generate a voltage Vp at the node N1 as an output. In particular, as stated, the detection circuit 902 may operate in a manner as was described in connection with the logic circuit 800 of FIG. 8. In particular, the transistor Mp1 corresponds to a p-channel MOSFET having a source configured to receive the power supply VS2, a drain operatively coupled to the node N1, and a gate configured to receive the signal Vbias. The transistor Mp1 may be configured to generate the current Iq0 based on its gate-source voltage produced by the power supply VS2 and the signal Vbias. As such, the transistor Mp1 may serve as a pull-up current source.

The pull-down circuit 106B has a first end operatively coupled to the node N1, a second end operatively coupled to the power supply VS1, and a third end operatively coupled to sense the voltage Vp of the first node N1. As the current Iq increases from 0 amperes (A), the pull-down circuit 106B is configured to set the voltage Vp of the node N1 to approximately VS1. As the current Iq becomes greater than Ith, the pull-up circuit (e.g., the transistor Mp1) will pull up the voltage Vp of the node N1.

The hysteresis circuit 904 may correspond to circuitry configured to reduce the threshold Ith of the detection circuit 902 if the voltage Vp is pulled up. For example, the hysteresis circuit 904 has a first end operatively coupled to the power supply VS2 and a second end operatively coupled to the node N1. In the illustrated embodiment, for example, the transistor Mp3 of the hysteresis circuit corresponds to a p-channel MOSFET having a drain operatively coupled to the node N1, a source operatively coupled to the drain of the transistor Mp4, and a gate operatively coupled to the waveform shaping circuit 906. The transistor Mp4 of the hysteresis circuit 904 corresponds to a p-channel MOSFET further having a source operatively coupled to the power supply VS2 and a gate configured to receive Vbias.

In operation, the hysteresis circuit 904 may generate a current offset Iq1 that may combine with the current Iq0 in order to reduce the threshold Ith. As will be described in greater detail in connection with the waveform shaping circuit 906, if the node N1 is pulled down, then the gate of the Mp3 is pulled high and thus the transistor Mp3 is turned off. Moreover, the hysteresis circuit 904 does not generate the current Iq0 and thus is not contributing to Iq. Accordingly, the hysteresis circuit 904 may have substantially no effect on the threshold Ith of the detection circuit 902 with respect to the amount of current Iq0 is needed to satisfy the Iq<Ith.

Alternatively, if the node N1 is pulled up (and if the voltage Vbg is greater than the threshold Vthn), then the gate of the Mp3 is pulled low and thus the transistor Mp3 is turned on. In this case, the hysteresis circuit 904 acts in parallel with the pull-up circuit of the detection circuit 902 to provide the current Iq. For example, if the pull-down circuit 106B and the hysteresis circuit 904 are activated, then the hysteresis circuit 904 may contribute current Iq1, which is added with Iq0 to form the current Iq. In effect, the current Iq1 produced by the hysteresis circuit 904 reduces the amount of current Iq0 that will deactivate the pull-down circuit 106B. That is, the detection circuit 902 will become deactivated if the inequality Iq0<Ith−Iq1 is satisfied. In this way, the hysteresis circuit 904 may reduce the threshold Ith of the detection circuit 902 if, in part, the node N1 is pulled high.

The waveform shaping circuit 906 corresponds to circuitry configured to generate the signal Bg_Bias_ok in accordance with one or more logic levels. For example, the waveform shaping circuit 906 is configured to receive the voltage Vp as an input and to generate the signal Bg_Bias_ok as an output. In particular, the transistors Mi1, Mi2 form a first CMOS inverter configured to receive Vp as an input and to generate a voltage V4 as an output. The transistors Mi3, Mi4 form a second CMOS invertor configured to receive the voltage V4 as an input and to generate the signal Bg_Bias_ok as an output. In other words, the first and second CMOS invertors are cascaded together. Accordingly, the signal Bg_Bias_ok may take on a value of a high logic level (e.g., approximately VS2) or a low logic level (e.g., approximately VS1).

Furthermore, the transistor Mbg may correspond to an n-channel MOSFET disposed between the first CMOS invertor and the power supply VS1. In particular, the transistor Mbg has a drain operatively coupled to the source of the transistor Mi1, a drain operatively coupled to the power supply VS1, and a gate configured to receive the signal Vbg. As such, the transistor Mbg may serve as a switch for blocking the action of the waveform shaping circuit 906. For example, the first CMOS inverter is inhibited from pulling the voltage V4 of node N4 high if the signal Vbg is less than about the threshold voltage Vthn of the transistor Mbg.

Additionally, the output V4 of the first CMOS inverter is fed back to the gate of the hysteresis circuit 904. Accordingly, the waveform shaping circuit 906 is further configured to activate the hysteresis circuit 904 if the voltage Vp of the node N1 is pulled high and if the signal Vbg is less than the threshold voltage Vthn of the transistor Mbg. Additionally or alternatively, the transistor Mbg may be configured to deactivate the hysteresis circuit 904 if the node N1 is pulled low. As stated, if the hysteresis circuit 904 is activated, then the hysteresis circuit 904 reduces the threshold Ith of the detection circuit 902.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Semiconductor devices are described herein as being specifically n-channel or p-channel transistors, but in many cases different polarities can also be utilized. Furthermore, semiconductor devices are described herein as being specifically a MOSFET-type transistors. However, it will be understood that MOSEFET devices include devices having a gate made from materials other than metals, such as polysilicon, and an insulation layer can be made out of materials other than silicon oxide, such as a high k dielectric.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72 (b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. An electrical signal detection circuit comprising:
    a sensing node;
    an output node;
    a pull-down node;
    a first pull-down circuit including a native metal-oxide-semiconductor field-effect transistor (MOSFET) to pull down the output node to approximately a voltage of the pull-down node; and
    a switch circuit including a junction field-effect transistor (JFET) that turns on the first pull-down circuit in response to a voltage of the sensing node being less than a first threshold, and turns off the first pull-down circuit in response to the voltage of the sensing node being greater than the first threshold.

2. The circuit of claim 1, wherein the first pull-down circuit has a first end coupled to the output node and a second end coupled to the pull-down node with the switch circuit disposed between the first pull-down circuit and the pull-down node.

3. The circuit of claim 1, wherein:
    the MOSFET has a drain, a source, and a gate, the drain of the MOSFET being coupled to the output node, the gate of the MOSFET being coupled to the pull-down node; and
    the JFET has a source coupled to the source of the MOSFET, a drain coupled to the pull-down node, and a gate coupled to the sensing node.

4. The circuit of claim 1, wherein the sensing node corresponds to at least one of the output node or a pull-up node.

5. The circuit of claim 1, wherein the MOSFET has a nearly zero threshold voltage, and the JFET has a pinch-off voltage corresponding to a positive gate-source voltage.

6. The circuit of claim 1, further comprising a pull-up circuit coupled to the output node.

7. The circuit of claim 1, further comprising an inverter circuit having an input coupled to the output node and an output to provide a signal indicative of the output voltage of the output node.

8. The circuit of claim 1, further comprising a hysteresis circuit having a first end coupled to the output node and a second end coupled to at least one of the first power supply node or the second power supply node, wherein the hysteresis circuit reduces the first threshold in response to the first pull-down circuit turning off.

9. The circuit of claim 1, further comprising:
    a second pull-down circuit connected, in parallel with the first pull-down circuit, to the output node;
    a second switch circuit to electrically couple the first pull-down circuit to the output node in response to a trimming signal; and
    a third switch circuit to electrically couple the second pull-down circuit to the output node in response to the trimming signal.

10. The apparatus of claim 1, further comprising:
    a voltage divider circuit having a first end coupled to the pull-down node, a second end coupled to a power supply node, and an output to provide a trimming voltage at a level between the pull-down node and power supply node, wherein at least one of the gate of the MOSFET or the gate of the JFET is connected to the output of the trimming circuit.

11. An electrical signal detection circuit comprising:
a first node to provide an output voltage;
first and second power supply nodes;
a pull-up circuit having a first end coupled to the second power supply node and a second end coupled to the first node; and
a first pull-down circuit having a first end coupled to the first node and a second end coupled to the first power supply node, the first pull-down circuit comprising:
a native n-channel metal-oxide-semiconductor field-effect transistor (MOSFET) having a drain, a source, and a gate, the drain of the MOSFET being coupled to the second end of the pull-up circuit, the gate of the MOSFET being coupled to the first power supply node; and
a p-channel junction field-effect transistor (JFET) having a source coupled to the source of the MOSFET, a drain coupled to the first power supply node, and a gate coupled to the second power supply node.

12. The circuit of claim 11, wherein the JFET closes a conduction path between the first node and the first power supply node and pulls down the first node to approximately the first power supply node in response to a voltage of the second power supply node being less than a first threshold, and wherein the JFET opens the conduction path between the first node and the first power supply node and the pull-up circuit pulls up the first node to approximately the second power supply node in response to the voltage of the second power supply node being greater than the first threshold.

13. The circuit of claim 11, wherein the first transistor has a nearly zero threshold voltage, and the second transistor has a pinch-off voltage corresponding to a positive gate-source voltage.

14. The circuit of claim 11, wherein the pull-up circuit comprises a pull-up current source circuit.

15. The circuit of claim 11, further comprising an inverter circuit having an input coupled to the first node and an output to provide a signal indicative of the output voltage of the first node.

16. An electrical signal detection circuit comprising:
a first node to provide an output voltage;
first and second power supply nodes;
a pull-up circuit having a first end coupled to the second power supply node and a second end coupled to the first node; and
a pull-down circuit having a first end coupled to the first node and a second end coupled to the first power supply node, the pull-down circuit comprising:
a native n-channel metal-oxide-semiconductor field-effect transistor (MOSFET) having a drain, a source, and a gate, the drain of the MOSFET being coupled to the second end of the current source, the gate of the MOSFET being coupled to the first power supply node; and
a p-channel junction field-effect transistor (JFET) having a source coupled to the source of the MOSFET, a drain coupled to the first power supply node, and a gate coupled to the first node.

17. The circuit of claim 16, wherein the JFET closes a conduction path formed by the MOSFET and the JFET and pulls down the first node to approximately the first power supply node in response to the pull-up circuit providing current less than a first threshold, and wherein the JFET opens the conduction path and the pull-up circuit pulls up the first node to approximately the second power supply in response to the pull-up circuit providing current greater than the threshold.

18. The circuit of claim 16, wherein the first transistor has a nearly zero threshold voltage, and the second transistor has a pinch-off voltage corresponding to a positive gate-source voltage.

19. The circuit of claim 16, wherein the pull-up circuit comprises a current mirror circuit.

20. The circuit of claim 16, further comprising an inverter circuit having an input coupled to the first node and an output to provide a signal indicative of the output voltage of the first node.

21. An electrical signal detection circuit comprising:
a first node;
an output node;
a third node;
a first including a native metal-oxide-semiconductor field-effect transistor (MOSFET) to pull the output node to approximately a voltage of the third node; and
a second circuit including a field-effect transistor (FET) that turns on the first circuit in response to a voltage of the first in a first range, and turns off the first circuit in response to the voltage of the first node in a second range.

22. The circuit of claim 21, wherein:
the MOSFET has a gate coupled to the third node; and
the FET has a gate coupled to the first node.

23. The circuit of claim 21, wherein the first node corresponds to a pull-up node.

24. The circuit of claim 21, wherein the MOSFET has a nearly zero threshold voltage.

* * * * *